United States Patent
Okikawa et al.

[11] 4,123,293
[45] Oct. 31, 1978

[54] METHOD OF PROVIDING SEMICONDUCTOR PELLET WITH HEAT SINK

[75] Inventors: Susumu Okikawa, Ohme; Osamu Yukawa, Kodaira; Hiroshi Mikino, Tachikawa; Yoshio Nonaka, Kodaira, all of Japan

[73] Assignee: Hitachi, Ltd., Japan

[21] Appl. No.: 663,471

[22] Filed: Mar. 3, 1976

[30] Foreign Application Priority Data

Mar. 7, 1975 [JP] Japan .................................. 50-27149

[51] Int. Cl.$^2$ .............................................. C22F 1/08
[52] U.S. Cl. ................................ 148/11.5 C; 29/590; 75/153; 75/154; 75/159; 148/11.5 Q; 148/13; 148/13.2; 148/32
[58] Field of Search .............. 148/1.5, 13, 13.2, 127, 148/32, 11.5 C, 11.5 Q; 75/154, 153, 159; 29/576, 590, 195 S

[56] References Cited

U.S. PATENT DOCUMENTS

| | | | |
|---|---|---|---|
| 1,969,702 | 8/1934 | Crampton et al. .................. 148/13.2 |
| 2,599,002 | 6/1952 | Klement ............................. 148/13 X |
| 2,897,107 | 7/1959 | Carlen et al. ...................... 148/13.2 |
| 2,971,251 | 2/1961 | Willemse ................................ 29/195 |
| 3,047,437 | 7/1962 | Brown, Jr. ........................ 148/13 X |
| 3,097,198 | 7/1963 | Fishwick et al. ................. 260/207 X |
| 3,143,442 | 8/1964 | Watts ............................... 148/13.2 X |
| 3,335,126 | 8/1967 | Baron et al. ........................ 260/207.1 |
| 3,342,804 | 9/1967 | Mueller ............................. 260/207 X |
| 3,359,256 | 12/1967 | Mueller et al. ............... 260/207.1 X |
| 3,398,135 | 8/1968 | Mueller ................................. 260/205 |
| 3,406,164 | 10/1969 | Altermatt et al. ............ 260/207.1 X |
| 3,445,454 | 5/1969 | Fishwick et al. ................. 260/207 X |
| 3,522,235 | 7/1970 | Baron et al. ........................... 260/207 |
| 3,544,550 | 12/1970 | Anderton et al. ................. 260/207.1 |
| 3,592,807 | 7/1971 | Von Brachel et al. ............ 260/207.1 |
| 3,637,651 | 1/1972 | Baron et al. ........................... 260/207 |

FOREIGN PATENT DOCUMENTS

1,114,603  5/1968  United Kingdom .................. 260/207.1

Primary Examiner—R. Dean
Attorney, Agent, or Firm—Craig & Antonelli

[57] ABSTRACT

A method of providing a silicon semiconductor pellet with a heat sink and a semiconductor device with such a heat sink. The heat sink to which the pellet is bonded with a eutectic alloy of gold and silicon interposed therebetween consists mainly of copper and contains a small amount of a metal other than copper and has been subjected to an annealing treatment.

13 Claims, 5 Drawing Figures

4,123,293

METHOD OF PROVIDING SEMICONDUCTOR PELLET WITH HEAT SINK

BACKGROUND OF THE INVENTION

1. Field of the Invention

This invention relates to a method of providing a silicon semiconductor pellet with a heat sink and a semiconductor device with a heat sink.

2. Description of the Prior Art

In the fabrication of semiconductor devices, bonding of silicon semiconductor pellets to heat sinks of copper tends to pose such a problem that temperature changes may fracture the silicon pellets to damage integrated circuits in the pellets. This results from the differences between the thermal expansion coefficients of the two materials. For this reason direct bonding of silicon semiconductor pellets about 1.2 mm sq. large or larger in size to heat sinks has hitherto been unfeasible.

To preclude the possibility of fracture of the silicon, it is necessary to interpose, between a silicon semiconductor pellet and a copper heat sink, a buffer such as a sheet of molybdenum whose thermal expansion coefficient is midway between those of silicon and copper, as proposed in U.S. Pat. No. 2,971,251 issued on Feb. 14, 1961 to Theo Willem Willemse, assignor to North American Phillips Company, Inc., New York, N.Y., entitled "SEMICONDUCTIVE DEVICE."

Thus, a common practice has involved pressure welding or brazing (or soldering) a molybdenum sheet to the surface of a copper heat sink, placing gold foil on the molybdenum sheet and heating them together so that gold-silicon eutectic alloy is formed thereby to connect the silicon pellet to the molybdenum. Or, the silicon pellet may be brazed or soldered to the combination of the copper heat sink and the molybdenum sheet without forming the gold-silicon eutectic alloy.

Extensive investigations have been made concerning possible causes for the above-mentioned problem. As a result, it has now been found that, with the conventional heat sinks which are made of oxygen-free copper, the heat treatment for pellet bonding completely anneals the copper and lowers its yield point with a result that the pellet bonded to the heat sink undergoes such strain at various temperatures as represented by the dashed-line curve $c$ in FIG. 2. A subsequent heat treatment such as for nail-head bonding (at about 310° C.) or some other treatments, for example for connection of the semiconductor device to a printed-circuit board (at about 250° C. when soldered), produces a tensile strain above the fracture limit, causing the device to be broken or fractured.

SUMMARY OF THE INVENTION

The present invention has for its main object to provide a method of providing a silicon semiconductor pellet with a heat sink, without subjecting the pellet to strain above the fracture limit of pellets on heating of semiconductor devices.

Another object of the invention is to provide a method of providing a silicon semiconductor pellet with a heat sink in which larger pellets than those heretofore used can be directly bonded to heat sinks, free from the above-mentioned drawbacks.

Still another object of the present invention is to provide a method of providing a silicon semiconductor pellet with a heat sink in which through the direct bonding of pellets to heat sinks, reduction of man-hours, saving of materials with the elimination of a buffer of molybdenum or the like, and increased durability against temperature cycles in operation are attained.

Still another object of the present invention is to provide a silicon semiconductor pellet with a heat sink free from the above-mentioned drawbacks.

According to the present invention a heat sink consisting mainly of copper contains a small amount of a metal other than copper and is annealed so that after a silicon semiconductor pellet has been bonded to the heat sink and cooled to the room temperature the compressive strain which the pellet undergoes is within a range from $-1700 \times 10^{-6}$ to $-2300 \times 10^{-6}$.

DESCRIPTION OF THE PREFERRED EMBODIMENTS

Figure 2:
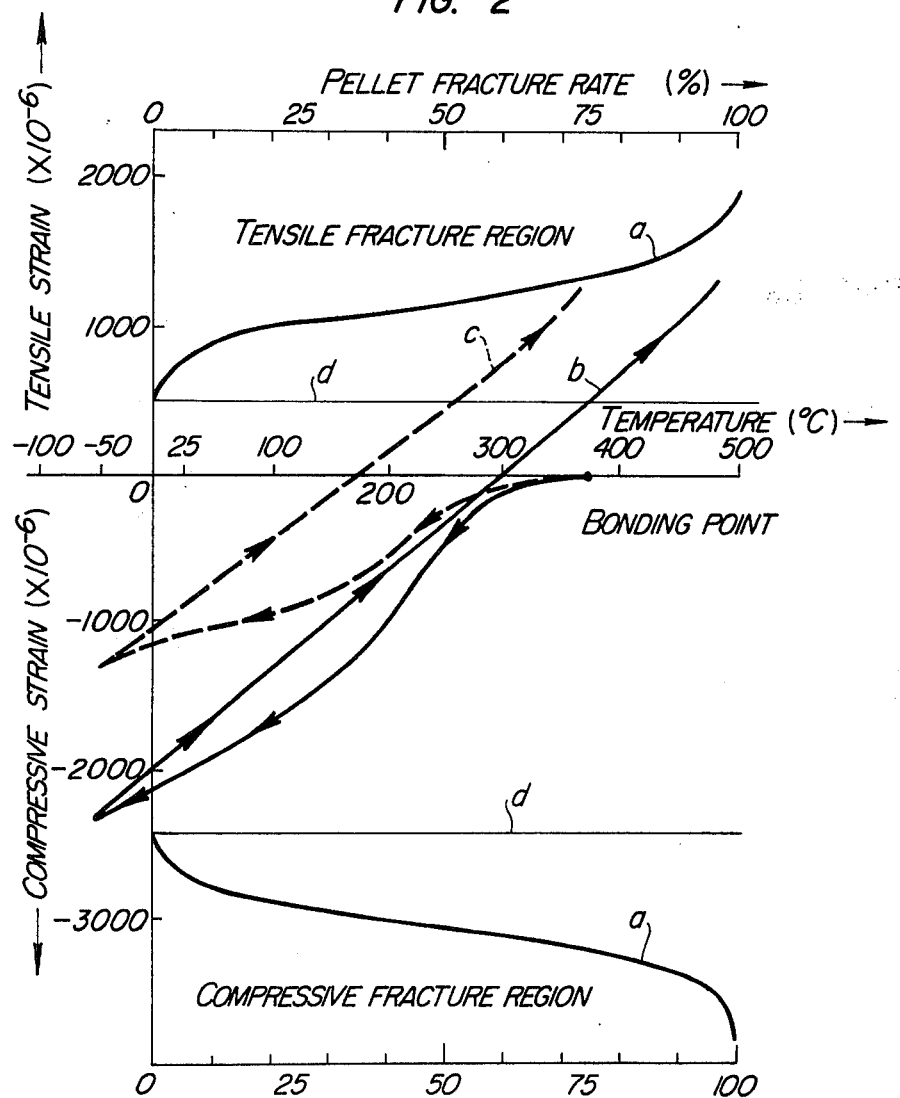
FIG. 2 is a graph showing a relationship between the strain which silicon semiconductor pellets undergo and the temperature and a relationship between the strain which a silicon semiconductor pellet undergoes and the rate of fracture of the pellet.

Usually, silicon semiconductor pellets may be fractured when undergoing a compressive strain greater than about $-2500 \times 10^{-6}$ or a tensile strain greater than $500 \times 10^{-6}$, as indicated by line $d$ in FIG. 2. It can be seen that the rate of fracture of the silicon pellet increases as the compressive (or the tensile) strain increases. The dashed-line curve $c$ represents a strain vs. temperature characteristic of a conventional semiconductor device including a silicon semiconductor pellet and a copper heat sink. Referring to the curve $c$, after the bonding of the silicon pellet to the copper heat sink is completed ("bonding point") to provide the semiconductor device, the latter is cooled down to the room temperature when the compressive strain in the pellet is increasing with decrease of the temperature of the semiconductor. Thus, when the temperature of the device is lowered to the room temperature, the device must undergo a certain compressive strain, i.e., an initial strain. Thereafter, the device may be further subjected to another heat treatment such as for the nail-head bonding or for the connection of the device to a printed-circuit board, as previously mentioned. Then, a serious problem is brought about in the following way: When the device is again heated, the strain in the silicon pellet gradually decreases back from the initial strain due to the differences between the thermal expansion coefficients of silicon and copper. A further increase of the temperature of the device beyond a certain level makes the compressive strain disappear and conversely gives birth to a tensile strain in the pellet, which grows with a further rise of the temperature of the device, until the tensile strain exceeds $500 \times 10^{-6}$ when the silicon pellet is fractured. Here, it should be understood that the positive portion of the ordinate of the graph of FIG. 2 indicates tensile strain and the negative portion indicates compressive strain.

Accordingly the present invention is based on the finding that by modifying the strain vs. temperature characteristic curve of the semiconductor device including a silicon semiconductor pellet and a heat sink such that the device is not subjected to a compressive strain greater than a maximum endurable compressive strain even at a lowest possible temperature (about $-50°$ C.) at which the device may be used, the silicon pellet is not fractured at a subsequent heating operation which is usually carried out at about 350° C. since the tensile strain which the device undergoes is smaller than a maximum endurable tensile strain of the device, i.e., smaller than about $500 \times 10^{-6}$.

In the present invention, a heat sink material consisting mainly of copper is prepared. The heat sink material contains about 0.10–0.13 weight % of Sn, Fe, Ag, Ni, Zn or P. The heat sink material is rolled to have a thickness of about 37–42% of that of the original thickness thereby to have a Vickers hardness of about 95–135 and shaped to have desired dimensions to form a heat sink. The heat sink is annealed at a temperature of about 390°–450° C. for about 3–10 minutes preferably in a non-oxidizing atmosphere such as a $N_2$ gas atmosphere thereby to lower the Vickers hardness of the heat sink to about 70–90. Thereafter a silicon semiconductor pellet is placed over the heat sink with gold foil interposed therebetween and the resulting assembly is pressed at a temperature of about 380°–450° C. Thereby, a eutectic alloy of gold and silicon is formed between the silicon semiconductor pellet and the heat sink to tightly bond them.

Thus, according to the present invention in which a heat sink consisting mainly of copper contains a small amount of a metal other than copper, it is possible to bond silicon semiconductor pellets of a considerably large size (e.g., as large as 3 mm sq. at the present stage of technological development) directly to such heat sinks as mentioned above without using conventionally required buffers such as of molybdenum, and a semiconductor device including a silicon semiconductor pellet provided with such a heat sink as mentioned above now has increased durability in repeated temperature cycles including connection of the device to a printed-circuit board, nail-head bonding of wires to the device and so forth.

It should be noted that the above-mentioned metal to be contained in small amount in the heat sink is such that the resulting heat sink undergoes the initial strain (compressive strain) within a range from $-1700 \times 10^{-6}$ to $-2300 \times 10^{-6}$ and has a heat dissipation capability not much smaller than that of the conventional semiconductor device. The term "initial strain" means here in the present invention strain produced in a silicon semiconductor pellet at the room temperature to which the temperature of the semiconductor device has been lowered down from the bonding temperature (a temperature at which a gold-silicon eutectic alloy is formed) or from higher temperature.

Figure 1A:
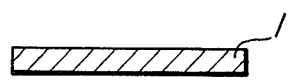
FIGS. 1a and 1b are diagrams illustrating an embodiment of the present invention.
Figure 1B:
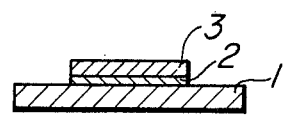

A most preferred embodiment of the invention will now be described with reference to FIGS. 1a, 1b and 2.

(a) A heat sink material consisting mainly of oxygen-free copper which contains tin is prepared. The tin content is about 0.10–0.13 weight % and, the combined content of copper and tin is 99.96 weight %.

(b) The heat sink material is rolled with a reduction of 42% to have a Vickers hardness $H_{mv}$ of 115.

(c) The material is processed and worked to a form of a heat sink (or header) 1, which is then annealed by heating at 420° C. for 5 minutes in a $N_2$ gas atmosphere to have a Vickers hardness $H_{mv}$ of 80.

(d) Next, a silicon semiconductor pellet 3 is scrubbed against the heat sink 1 with gold foil 2 interposed therebetween. This is accomplished while they are heated at a heater temperature of 440° C. Since gold and silicon in contact form a eutectic by heating them to about 375° C., the pellet is affixed to the heat sink through the gold-silicon eutectic alloy thus formed in between.

In FIG. 2, the solid line curve $b$ represents a strain vs. temperature relationship with respect to the semiconductor device obtained as mentioned above. More particularly, after the bonding of the silicon pellet to the heat sink is completed ("bonding point") to provide the semiconductor device, the latter is naturally cooled down when some compressive strain is produced in the silicon pellet due to the disagreement of the thermal expansion coefficients of copper and silicon. Thus, at the normal or the room temperature (about 25° C.) the strain the pellet undergoes amounts to approximately $-2000 \times 10^{-6}$, as indicated in FIG. 2, $b$. With a gradual increase of the temperature of the semiconductor device the compressive strain in the pellet decreases accordingly and nearly at a temperature of 300° C. the strain is reduced to zero. With a further increase of the temperature of the device, the latter now begins to undergo tensile strain increasing with a temperature rise. It should be noted that even the device is reheated to a temperature corresponding to the "bonding point" (around 375° C.) the tensile strain undergone by the device is $500 \times 10^{-6}$ which is small enough to be outside the tensile fracture region defined by FIG. 2, line $d$.

Thus, by the use of the tin-containing copper heat sink and by annealing it the initial strain of the pellet is made to be within a range from $-700 \times 10^{-6}$ to $-2300 \times 10^{-6}$ so that the compressive strain at the lowest operation temperature of the device is out of the compressive fracture region defined by FIG. 2, line $d$ and therefore no serious tensile strain results even at rather high temperatures during the reheating. For example, the strain that appears in the silicon pellet at 350° C. is not more than $500 \times 10^{-6}$ or not high enough to invite any fracture of the pellet.

This means that the semiconductor device or the pellet remains unfractured by any subsequent heat treatment such as for the nail-head bonding following the bonding of the silicon pellet to the heat sink or for assembling the semiconductor device on a printed-circuit board because the subsequent heating or reheating treatment brings about only such strain that is not within the tensile fracture region.

Figure 3:
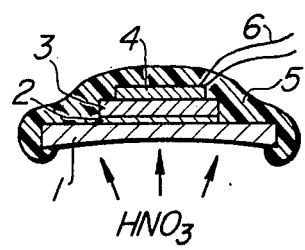
FIG. 3 is a diagram illustrating how the initial strain in a silicon semiconductor pellet bonded to a heat sink is determined.

The initial strain of the silicon semiconductor pellet is determined in such a way as illustrated in FIG. 3.

Figure 4:
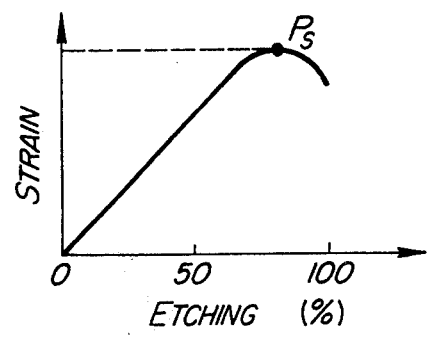
FIG. 4 is a graph showing the output of a strain gage used in the strain determination illustrated in FIG. 3.

After the pellet bonding the resulting semiconductor device is kept at the room temperature or the normal temperature. A strain gage 4 is affixed to the surface of the silicon pellet 3 and the resulting assembly is covered with a resin 5. Then, the heat sink 1 is etched away from the rear side of the device, and the change in the electric signals derived from the strain gage before and after the etching is plotted. FIG. 4 shows the result of the plotting.

As is shown in FIG. 4, the strain detected by means of the gage 4 increases with increase in the volume amount of the heat sink material removed by etching, but the peak $P_s$ of the strain is reached before the whole heat sink is etched away. The initial strain is not represented by the value observed at the end of 100% etching but by the peak value $P_s$.

We claim:

1. A method of providing a silicon semiconductor pellet with a heat sink consisting mainly of copper, comprising the steps of incorporating about 0.10–0.13 weight % of a metal into said heat sink, said metal being Sn, Fe or Ag, annealing the heat sink into which said metal has been incorporated, and bonding a silicon pellet to the resulting heat sink by interposing a gold layer between said heat sink and said silicon pellet and by heating the resultant assembly to a temperature at which an eutectic alloy is formed of gold and silicon.

2. The method according to claim 1 in which said annealing is carried out by heating said heat sink at a temperature of about 390°–450° C. for about 3–10 minutes.

3. The method according to claim 2 in which said metal is Sn.

4. A method of providing a silicon semiconductor pellet with a heat sink consisting mainly of copper, comprising the steps of incorporating about 0.10–0.13 weight % of a metal into said heat sink, said metal being Ni, annealing the heat sink into which said metal has been incorporated, and bonding a silicon pellet to the resulting heat sink by interposing a gold layer between said heat sink and said silicon pellet and by heating the resultant assembly to a temperature at which an eutectic alloy is formed of gold and silicon.

5. The method according to claim 4, in which said annealing is carried out by heating said heat sink at a temperature of about 390°–450° C. for about 3–10 minutes.

6. A method of providing a silicon semiconductor pellet with a heat sink comprising the steps of:
preparing a heat sink material consisting mainly of copper, said heat sink material containing about 0.10–0.13 weight % of a metal selected from the group consisting of Sn, Fe, Ag, Ni, Zn and P;
rolling said heat sink material;
shaping the rolled heat sink material into a heat sink having desired dimensions;
annealing said heat sink; and
placing said silicon semiconductor pellet over said heat sink with gold foil interposed therebetween and scrubbing them at a temperature for forming a eutectic alloy between said gold foil and said silicon semiconductor pellet.

7. The method according to claim 6, in which said rolling is performed with a reduction of about 37–42%, said annealing is performed by a heat treatment at a temperature of about 390°–450° C. for about 3–10 minutes, and said eutectic alloy forming temperature is about 380°–450° C.

8. The method according to claim 6, in which said annealing is performed in a non-oxidizing atmosphere.

9. The method according to claim 8, in which said non-oxidizing atmosphere is a $N_2$-gas atmosphere.

10. A method of providing a silicon semiconductor pellet with a heat sink comprising the steps of:
preparing a heat sink material consisting mainly of copper, said heat sink material containing about 0.10–0.13 weight % of a metal selected from the group consisting of Sn, Fe, and Ag;
rolling said heat sink material;
shaping the rolled heat sink material into a heat sink having desired dimensions;
annealing said heat sink; and
placing said silicon semiconductor pellet over said heat sink with gold foil interposed therebetween and scrubbing them at a temperature for forming a eutectic alloy between said gold foil and said silicon semiconductor pellet.

11. The method according to claim 10, in which said rolling is performed with a reduction of about 37–42%, said annealing is performed by a heat treatment at a temperature of about 390°–450° C. for about 3–10 minutes, and said eutectic alloy forming temperature is about 380°–450° C.

12. The method according to claim 10, in which said annealing is performed in a non-oxidizing atmosphere.

13. The method according to claim 12, in which said non-oxidizing atmosphere is a $N_2$-gas atmosphere.

* * * * *